US012669534B2

(12) United States Patent
Takahashi

(10) Patent No.: US 12,669,534 B2
(45) Date of Patent: Jun. 30, 2026

(54) FAILURE DETECTION DEVICE

(71) Applicant: YAZAKI CORPORATION, Tokyo (JP)

(72) Inventor: Atsushi Takahashi, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 165 days.

(21) Appl. No.: 18/900,633

(22) Filed: Sep. 28, 2024

(65) Prior Publication Data

US 2025/0123318 A1 Apr. 17, 2025

(30) Foreign Application Priority Data

Oct. 17, 2023 (JP) ................................. 2023-178764

(51) Int. Cl.
*G01R 31/26* (2020.01)
(52) U.S. Cl.
CPC ................................ *G01R 31/2621* (2013.01)

(58) Field of Classification Search
CPC ........................... G01R 31/26; G01R 31/2621; G01R 31/2633; G01R 19/15; G01R 19/155; G01R 19/165; G01R 31/3271; G01R 31/327; H03K 17/687; H03K 17/6871
See application file for complete search history.

(56) References Cited

FOREIGN PATENT DOCUMENTS

| | | |
|---|---|---|
| JP | 2009259762 A | 11/2009 |
| JP | 2019054384 A | 4/2019 |
| JP | 2021-85733 A | 6/2021 |

*Primary Examiner* — Son T Le
(74) *Attorney, Agent, or Firm* — KENEALY VAIDYA LLP

(57) ABSTRACT
A failure detection device includes a first, second and third switch units, and a failure detection unit detecting an ON failure of the first switch unit and the second switch unit. The failure detection unit includes a voltage application unit applying a specified voltage to the connection point in a superimposed manner when all of the first, second, and third switch units are controlled to be turned off, a voltage detection unit detecting a voltage of the connection point in an application state by the voltage application unit, and an ON failure determination unit determining that at least one of the first and second switch units has an ON failure when the voltage detected by the voltage detection unit is not greater than or equal to a threshold.

3 Claims, 4 Drawing Sheets

FAILURE DETECTION DEVICE

CROSS-REFERENCE TO RELATED APPLICATIONS

This application is based on and claims priority under 35 USC 119 from Japanese Patent Application No. 2023-178764 filed on Oct. 17, 2023, the contents of which are incorporated herein by reference.

TECHNICAL FIELD

The present invention relates to a failure detection device.

BACKGROUND ART

In the related art, a failure detection device that detects an abnormality such as an ON failure and an OFF failure in a switch unit such as a field effect transistor (FET) has been proposed (see Patent Literature 1).

CITATION LIST

Patent Literature

Patent Literature 1: JP2021-85733A

SUMMARY OF INVENTION

In the failure detection device described in Patent Literature 1, back-to-back metal oxide semiconductor field effect transistors (MOSFETs) are a target of failure detection. Here, in a diode OR configuration using the drain connected MOSFETs, even when the MOSFETs are turned off, a bypass path is present due to a parasitic diode, and the MOSFETs cannot be completely turned off, and thus the ON failure cannot be detected.

As a countermeasure, when a DC/DC converter is provided as a power supply in each of the diode OR configurations, it is possible to provide a potential difference between the MOSFETs by increasing or decreasing an output voltage, and it is possible to detect the ON failure. However, in practice, the output voltage is determined by equipment to which the voltage is supplied, such as vehicle equipment and the like, and since the pieces of equipment basically operate at the same voltage, it is not possible to freely increase or decrease the voltage, and thus it is not possible to detect the ON failure.

Therefore, a diode OR configuration in which two of a pair of back-to-back switch units are combined is required, and at least four switch units are required, which increases the number of switch units.

Accordingly, the present disclosure provides a failure detection device capable of detecting an ON failure while suppressing the number of switch units.

A failure detection device according to the present disclosure includes a first switch unit in which a first terminal is connected to a first battery that outputs a predetermined voltage and a second terminal is connected to a connection point, and that includes a parasitic diode preventing a current from flowing from the second terminal to the first terminal; a second switch unit in which a first terminal is connected to a second battery that outputs the predetermined voltage and a second terminal is connected to the connection point, and that includes a parasitic diode preventing a current from flowing from the second terminal to the first terminal; a third switch unit in which a first terminal is connected to a load and a second terminal is connected to the connection point, and that includes a parasitic diode preventing a current from flowing from the second terminal to the first terminal; and a failure detection unit that detects an ON failure of the first switch unit and the second switch unit. The failure detection unit includes a voltage application unit applying a specified voltage to the connection point in a superimposed manner when all of the first switch unit, the second switch unit, and the third switch unit are controlled to be turned off, a voltage detection unit detecting a voltage of the connection point in an application state by the voltage application unit, and an ON failure determination unit determining that at least one of the first switch unit and the second switch unit has an ON failure when the voltage detected by the voltage detection unit exceeds the predetermined voltage, and is not greater than or equal to a threshold set to be less than a value obtained by subtracting a voltage drop due to the parasitic diode of the first switch unit and the parasitic diode of the second switch unit after adding the specified voltage to the predetermined voltage.

According to the present disclosure, it is possible to provide a failure detection device capable of detecting an ON failure while suppressing the number of switch units.

DESCRIPTION OF EMBODIMENTS

Hereinafter, the present invention will be described with reference to preferred embodiment. The invention is not limited to the embodiment to be described below, and the embodiment can be appropriately modified without departing from the scope of the invention. In the embodiment to be described below, there may be portions in which illustration and description of a part of a configuration are omitted, and it is needless to say that a known or well-known technique is appropriately applied to the details of an omitted technique within a range in which no contradiction with the contents to be described below occurs.

Figure 1:
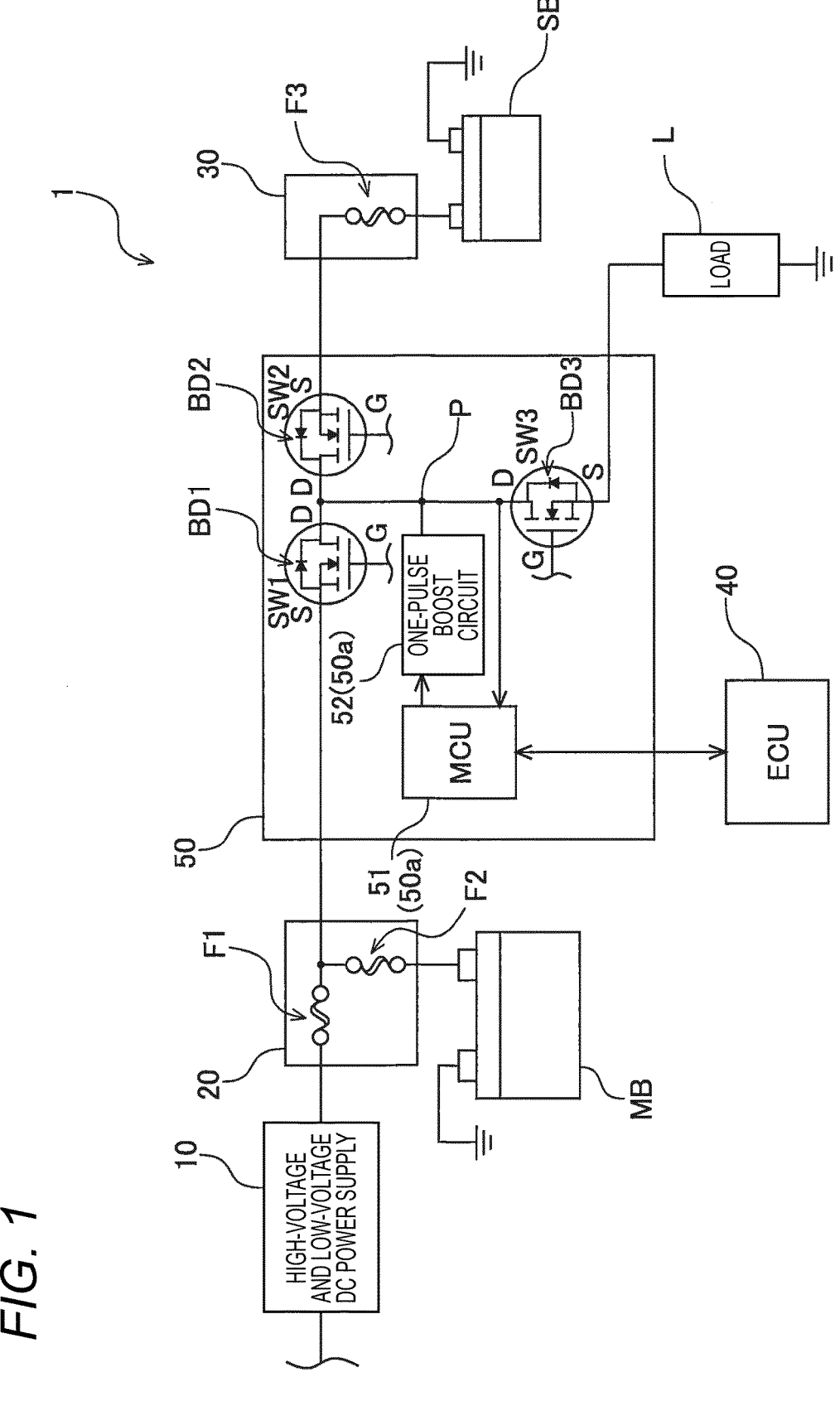
FIG. 1 is a block diagram including a power supply system including a failure detection device according to an embodiment.

FIG. 1 is a block diagram including a power supply system including a failure detection device according to the present embodiment. A power supply system 1 shown in FIG. 1 supplies power to a load L, and includes a high-voltage and low-voltage DC power supply 10, a main battery (first battery) MB, a battery fuse terminal (hereinafter, referred to as BFT) 20, a sub-battery (second battery) SB, a BFT 30, an electronic control unit (ECU) 40, and a changeover switch (failure detection device) 50.

The high-voltage and low-voltage DC power supply 10 is implemented by a DC/DC converter that decreases a voltage from a high-voltage power supply. The high-voltage and low-voltage DC power supply 10 decreases the voltage from the high-voltage power supply to a predetermined voltage (for example, 12 V), which is an operating voltage, of the load L. The high-voltage and low-voltage DC power supply 10 supplies power to the changeover switch 50 via a first fuse F1 in the BFT 20 after the voltage is decreased.

The main battery MB can supply the predetermined voltage (for example, 12 V), which is the operating voltage, to the load L, and is implemented by, for example, a lead storage battery. The main battery MB supplies power to the changeover switch 50 via a second fuse F2 in the BFT 20.

The sub-battery SB is capable of supplying the predetermined voltage (for example, 12 V), which is the operating voltage, to the load L, and is implemented by, for example, the lead storage battery or a lithium ion battery. The sub-battery SB can supply the same voltage as the main battery MB, and supplies power to the changeover switch 50 via a third fuse F3 in the BFT 30.

The ECU 40 corresponds to a higher-level device that controls the changeover switch 50. The changeover switch 50 switches a power supply path to the load L. In the present embodiment, the load L is assumed to be, for example, an important load required for a vehicle to travel. The power supply system 1 includes the changeover switch 50 in order to avoid a situation in which power cannot be supplied to the load L. For example, when the power cannot be supplied from a main battery MB side (including the high-voltage and low-voltage DC power supply 10), the power supply system 1 controls the changeover switch 50 to supply power from the sub-battery SB to the load L.

The changeover switch 50 includes first to third switch units SW1 to SW3, a memory control unit (MCU) 51, and a one-pulse boost circuit (boost unit) 52. The MCU 51 and the one-pulse boost circuit 52 constitute a failure detection part (failure detection unit) 50a that detects whether at least one of the first switch unit SW1 and the second switch unit SW2 has an ON failure.

The first switch unit SW1 is implemented by a MOSFET, a source terminal (first terminal) S is connected to a BFT 20 side, that is, the main battery MB, and a drain terminal (second terminal) D is connected to a connection point P. The gate terminal G is configured to receive a gate signal from the ECU 40 or the MCU 51 that receives an instruction from the ECU 40. The first switch unit SW1 includes a parasitic diode BD1 that allows a current from the source terminal S to the drain terminal D and blocks a current from the drain terminal D to the source terminal S.

The second switch unit SW2 is implemented by a MOS-FET, the source terminal (first terminal) S is connected to a BFT 30 side, that is, the sub-battery SB, and the drain terminal (second terminal) D is connected to the connection point P. Similarly to the first switch unit SW1, the gate terminal G receives a gate signal from the ECU 40 or the MCU 51. The second switch unit SW2 includes a parasitic diode BD2 that allows a current from the source terminal S to the drain terminal D and blocks a current from the drain terminal D to the source terminal S. The first switch unit SW1 and the second switch unit SW2 constitute a diode OR circuit.

The third switch unit SW3 is also implemented by a MOSFET, the source terminal (first terminal) S is connected to the load L, and the drain terminal (second terminal) D is connected to the connection point P. Similarly to the first switch unit SW1, the gate terminal G receives a gate signal from the ECU 40 or the MCU 51. The third switch unit SW3 includes a parasitic diode BD3 that allows a current from the drain terminal D to the source terminal S and blocks a current from the drain terminal D to the source terminal S.

Figure 2:
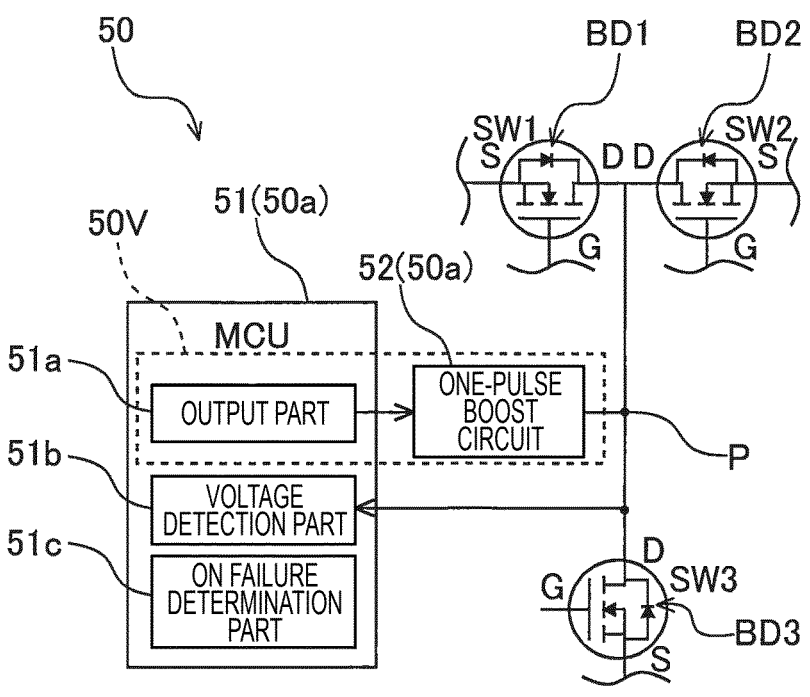
FIG. 2 is a block diagram showing details of a changeover switch shown in FIG. 1.

FIG. 2 is a block diagram showing details of the changeover switch 50 shown in FIG. 1. As shown in FIG. 2, the MCU 51 of the changeover switch 50 includes an output part (output unit) 51a, a voltage detection part (voltage detection unit) 51b, and an ON failure determination part (ON failure determination unit) 51c in order to determine the ON failure of the first switch unit SW1 and the second switch unit SW2.

The output part 51a outputs a voltage, for example, a 5 V voltage, to be applied to the connection point P in a superimposed manner. The output part 51a outputs a one-pulse voltage that is turned on for minimum time. The one-pulse boost circuit 52 boosts the one-pulse voltage from the output part 51a and applies the boosted one-pulse voltage to the connection point P in a superimposed manner. The output part 51a and the one-pulse boost circuit 52 constitute a voltage application part (voltage application unit) 50 V. When all of the first switch unit SW1, the second switch unit SW2, and the third switch unit SW3 are controlled to be turned off by the ECU 40 (see FIG. 1) or the MCU 51, the voltage application part 50 V applies a boost voltage based on a one-pulse voltage to the connection point P as a specified voltage in a superimposed manner.

Figure 3:
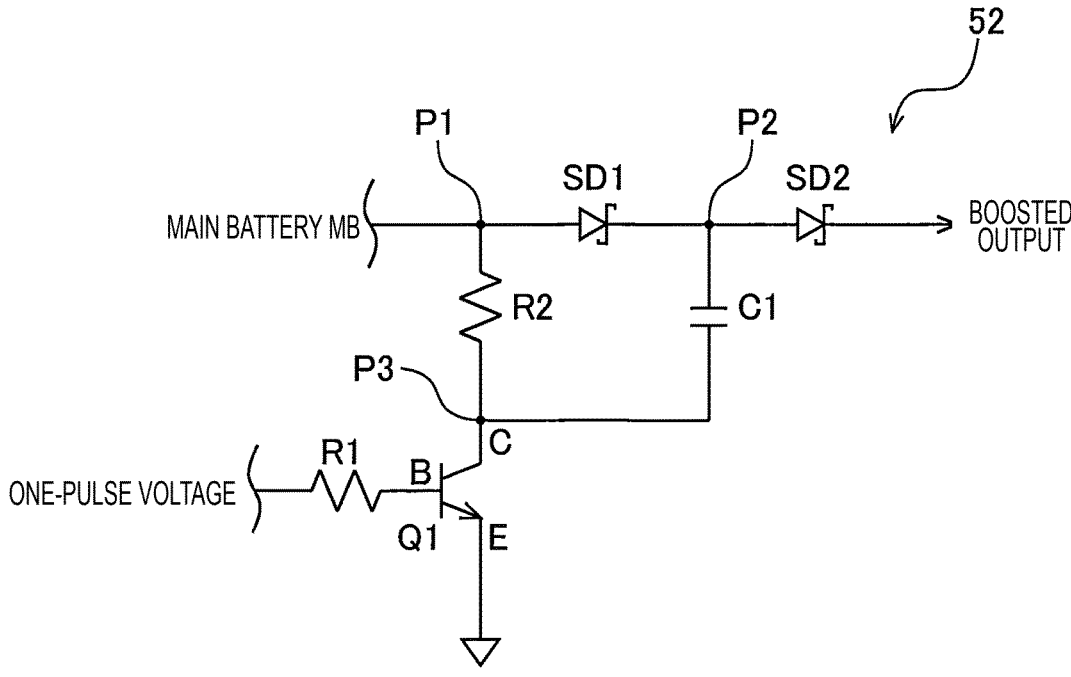
FIG. 3 is a circuit diagram showing a detailed example of a one-pulse boost circuit shown in FIG. 2.

FIG. 3 is a circuit diagram showing a detailed example of the one-pulse boost circuit 52 shown in FIG. 2. As shown in FIG. 3, for example, the one-pulse boost circuit 52 includes an NPN transistor Q1, resistors R1, R2, a capacitor C1, and Schottky barrier diodes SD1, SD2.

The one-pulse voltage from the output part 51a (see FIG. 2) is input to a base B of the NPN transistor Q1 via the resistor R1. A collector C of the NPN transistor Q1 is connected to the main battery MB via the resistor R2. An emitter E of the NPN transistor Q1 is grounded.

A connection point P1 between the main battery MB and the resistor R2 is connected to an anode of the Schottky barrier diode SD1. A cathode of the Schottky barrier diode SD1 is connected to an anode of the other Schottky barrier diode SD2. A cathode of the Schottky barrier diode SD2 serves as a boosted output part (output part of the specified voltage).

A connection point P2 between the two Schottky barrier diodes SD1, SD2 is connected to a connection point P3 between the resistor R2 and the collector C of the NPN transistor Q1 via the capacitor C1.

Reference is made again to FIG. 2. The voltage detection part 51b detects the voltage applied to the connection point P. The ON failure determination part 51c determines whether the ON failure has occurred in the first switch unit SW1 or the second switch unit SW2 based on the voltage detected by the voltage detection part 51b. The ON failure determination part 51c determines the ON failure based on whether the voltage detected by the voltage detection part 51b is greater than or equal to a threshold. The threshold is set to a value that exceeds a predetermined voltage, which is an output voltage of the batteries MB, SB, and is less than a value obtained by subtracting a voltage drop due to the parasitic diodes BD1, BD2 to be described later from a value obtained by adding the specified voltage to the predetermined voltage. When the detected voltage is greater than or equal to the threshold, the ON failure determination part 51c determines that the ON failure has not occurred in either the first switch unit SW1 or the second switch unit SW2. On the other hand, when the detected voltage is not greater than or equal to the threshold, the ON failure determination part 51c determines that the ON failure has occurred in at least one of the first switch unit SW1 and the second switch unit SW2.

Figure 4:
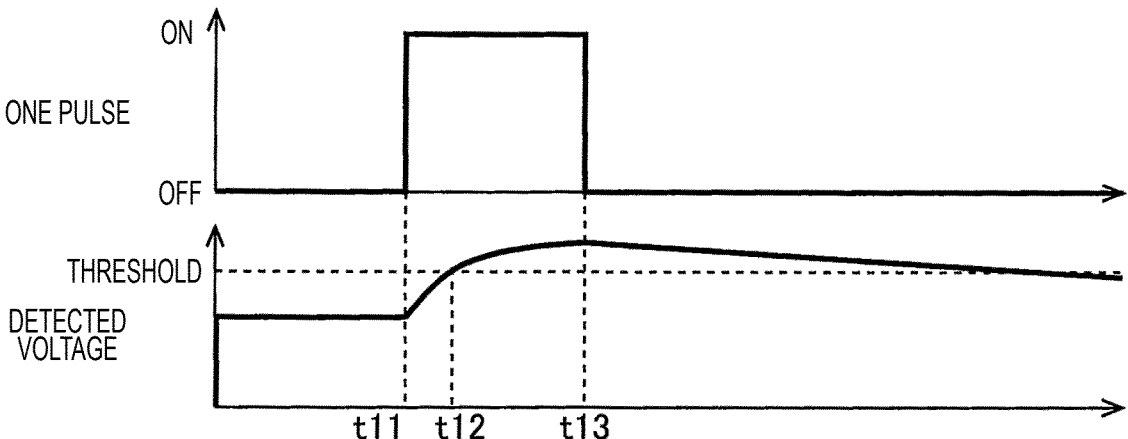
FIG. 4 is a timing chart showing a voltage state when an ON failure has not occurred.
Figure 5:
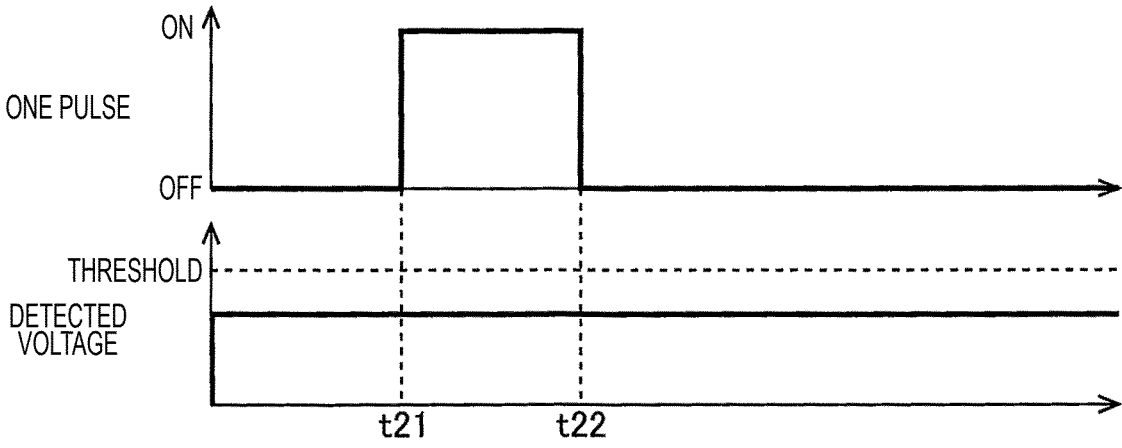
FIG. 5 is a timing chart showing a voltage state when the ON failure occurs.

Next, an outline of an ON failure determination method by the ON failure determination part 51c will be described with reference to FIGS. 2, 4, and 5. FIG. 4 is a timing chart showing a voltage state when the ON failure has not occurred, and FIG. 5 is a timing chart showing a voltage state when the ON failure has occurred.

First, the case where the ON failure has not occurred will be described. As shown in FIG. 2, the first switch unit SW1 and the second switch unit SW2 have the parasitic diodes BD1, BD2, respectively, and the parasitic diodes BD1, BD2 are oriented to allow currents flowing from the batteries MB, SB to the connection point P. Here, if the voltages (predetermined voltages) of the main battery MB and the sub-battery SB are 12 V, a voltage obtained by subtracting the voltage drop of the parasitic diodes BD1, BD2 from 12 V is applied to the connection point P. For example, when the voltage drop of the parasitic diodes BD1, BD2 is 0.6 V, a voltage of 12 V−0.6 V=11.4 V is applied to the connection point P.

The voltage application part 50 V applies a specified voltage to the connection point P to which the voltage is applied in a superimposed manner. Here, it is assumed that the output part 51a outputs the 5 V voltage at a time point t11 shown in FIG. 4. The 5 V voltage is boosted to 12 V over time. Accordingly, the voltage of 11.4 V+12 V (=23.4 V) is finally applied to the connection point P. Here, the threshold is set to less than 23.4 V. In the example shown in FIG. 4, the voltage detected by the voltage detection part 51b is greater than or equal to the threshold at least at a time point t12. The state where the detected voltage is greater than or equal to the threshold continues at least until a time point t13 when the one-pulse voltage is turned off. Thus, when the detected voltage is greater than or equal to the threshold, the ON failure determination part 51c determines that the ON failure has not occurred in either the first switch unit SW1 or the second switch unit SW2.

On the other hand, when the ON failure has occurred, the connection point P is in a conductive state with at least one of the main battery MB and the sub-battery SB. Therefore, the voltage of the connection point P is fixed to the predetermined voltage. Therefore, even if the output part 51a outputs the 5 V voltage at a time point t21 shown in FIG. 5, the 12 V voltage is maintained until a time point t22 when the one-pulse voltage is turned off. Here, the threshold is a value exceeding 12 V. Thus, when the detected voltage is not greater than or equal to the threshold, the ON failure determination part 51c determines that the ON failure has occurred in at least one of the first switch unit SW1 and the second switch unit SW2.

As shown in FIG. 4, the detected voltage has a maximum value in the vicinity of the time point t13 when the one-pulse voltage is turned off. Therefore, the voltage detection part 51b preferably detects the voltage of the connection point P in the vicinity of the time point t13 at which the one-pulse voltage is turned off. Accordingly, it is possible to prevent the determination from being erroneously made at a timing at which the voltage is not sufficiently boosted before the time point t12. Here, as an example, the vicinity of the time point t13 refers to a period from a time point t13−α to a time point t13+α in a case where time a is half the time from the time point t12 at which the detected voltage matches the threshold to the time point t13 when the ON failure does not occur.

Figure 6:
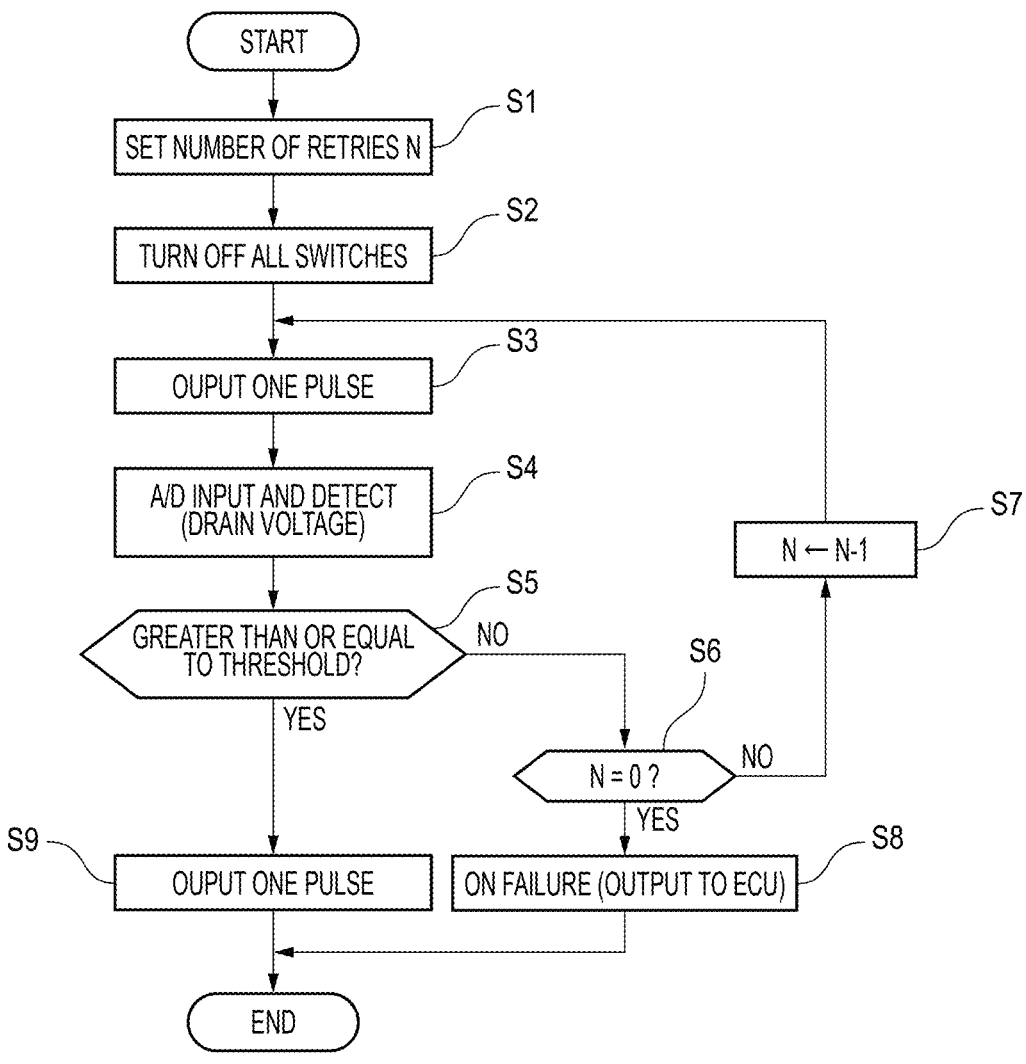
FIG. 6 is a flowchart showing an ON failure determination method in an MCU of a changeover switch according to the present embodiment.

FIG. 6 is a flowchart showing an ON failure determination method in the MCU 51 of the changeover switch 50 according to the present embodiment. As shown in FIG. 6, first, the MCU 51 sets the number of retries N (S1). For example, in the present embodiment, the number of retries N is assumed to be "3".

Next, the MCU 51 turns off all the switch units SW1 to SW3 (S2). Next, the output part 51a of the MCU 51 outputs a one-pulse voltage (S3). The one-pulse voltage is boosted by the one-pulse boost circuit 52 and applied to the connection point P.

Thereafter, the voltage detection part 51b detects a voltage (drain voltage) of the connection point P by A/D input (S4). Next, the ON failure determination part 51c determines whether the voltage detected in step S4 is greater than or equal to a threshold (S5).

When the detected voltage in step S4 is not greater than or equal to the threshold (S5: NO), the MCU 51 determines whether the number of retries N is "0" (S6). When the number of retries N is not "0" (S6: NO), the MCU 51 decrements the number of retries N (S7), and the processing proceeds to step S3. When the number of retries N is "0" (S6: YES), the ON failure determination part 51c determines that at least one of the first switch unit SW1 and the second switch unit SW2 has an ON failure, and outputs the determination result to the ECU 40 (S8). Thereafter, the processing shown in FIG. 6 ends.

On the other hand, when the detected voltage in step S4 is greater than or equal to the threshold (S5: YES), the ON failure determination part 51c determines that the ON failure has not occurred in either the first switch unit SW1 or the second switch unit SW2 (S9). Thereafter, the processing shown in FIG. 6 ends.

In this way, according to the changeover switch 50 of the present embodiment, when the ON failure has occurred from the directions of the parasitic diodes BD1, BD2 of the switch units SW1, SW2, the voltage based on the batteries MB, SB (the voltage slightly lower than the predetermined voltage) is applied to the connection point P. Further, at the time of ON failure determination, the specified voltage applied by the voltage application part 50 V is applied to the connection point P. Therefore, when the ON failure has not occurred, a voltage obtained by adding the specified voltage to the voltage slightly lower than the predetermined voltage should be detected. Therefore, by appropriately setting the threshold, the ON failure determination part 51c can determine that the ON failure has not occurred in each of the switch units SW1, SW2 when the detected voltage at the connection point P is greater than or equal to the threshold.

On the other hand, during the ON failure, the connection point P is short-circuited with the main battery MB or the sub-battery SB, and the connection point P is at the predetermined voltage. Therefore, when the voltage of the connection point P is not greater than or equal to the threshold exceeding the predetermined voltage, the ON failure determination part 51c can determine that at least one of the first switch unit SW1 and the second switch unit SW2 has the ON failure.

In addition, since at least three switch units SW1 to SW3 can be used for determining the ON failure, the number of switch units can be reduced. Accordingly, it is possible to provide the failure detection device capable of detecting the ON failure while suppressing the number of switch units SW1 to SW3.

The voltage application part 50 V includes the output part 51a that outputs the voltage to be applied to the connection point P, and the one-pulse boost circuit 52 that boosts the voltage output from the output part 51a. Therefore, the voltage, for example, the 5 V voltage can be output from the MCU 51 to be applied to the connection point P, and the output voltage can be boosted so that a relatively high voltage can be applied. Accordingly, a voltage difference at the connection point P is increased between when the ON failure occurs and when the ON failure does not occur, and the ON failure can be detected more appropriately.

Further, since the output part 51a outputs the one-pulse voltage, unnecessary power consumption can be minimized.

Although the present invention is described above based on the embodiment, the present invention is not limited to the above embodiment, a modification may be made without departing from the gist of the present invention, and the known or well-known techniques may be combined.

For example, although the output part 51a outputs the one-pulse voltage in the above embodiment, the output part 51a is not particularly limited to the one-pulse voltage as long as the voltage can be applied to the connection point P in the superimposed manner. The changeover switch 50 includes the one-pulse boost circuit 52, boosts the voltage to 12 V or the like from 5 V or the like from the output part 51a, and applies the boosted voltage to the connection point P. However, the present invention is not particularly limited thereto, and the voltage may be applied without being boosted. It is understood that the specified voltage applied in this case is larger than the voltage drop caused by the parasitic diodes BD1, BD2.

What is claimed is:

1. A failure detection device comprising:

a first switch unit in which a first terminal is connected to a first battery that outputs a predetermined voltage and a second terminal is connected to a connection point, and that includes a parasitic diode preventing a current from flowing from the second terminal of the first switch unit to the first terminal of the first switch unit;

a second switch unit in which a first terminal is connected to a second battery that outputs the predetermined voltage and a second terminal is connected to the connection point, and that includes a parasitic diode preventing a current from flowing from the second terminal of the second switch unit to the first terminal of the second switch unit;

a third switch unit in which a first terminal is connected to a load and a second terminal is connected to the connection point, and that includes a parasitic diode preventing a current from flowing from the second terminal of the third switch unit to the first terminal of the third switch unit; and a failure detection unit that detects an ON failure of the first switch unit and the second switch unit, wherein the failure detection unit includes a voltage application unit applying a specified voltage to the connection point in a superimposed manner when all of the first switch unit, the second switch unit, and the third switch unit are controlled to be turned off, a voltage detection unit detecting a voltage of the connection point in an application state by the voltage application unit, and an ON failure determination unit determining that at least one of the first switch unit and the second switch unit has an ON failure when the voltage detected by the voltage detection unit exceeds the predetermined voltage, and is not greater than or equal to a threshold set to be less than a value obtained by subtracting a voltage drop due to the parasitic diode of the first switch unit and the parasitic diode of the second switch unit after adding the specified voltage to the predetermined voltage.

2. The failure detection device according to claim 1, wherein the voltage application unit includes an output unit outputting a voltage to be applied to the connection point, and a boost unit boosting the voltage output from the output unit.

3. The failure detection device according to claim 2, wherein the output unit outputs a one-pulse voltage.

* * * * *